(12) United States Patent
Adachi et al.

(10) Patent No.: US 7,253,082 B2
(45) Date of Patent: Aug. 7, 2007

(54) PASTED SOI SUBSTRATE, PROCESS FOR PRODUCING THE SAME AND SEMICONDUCTOR DEVICE

(75) Inventors: Naoshi Adachi, Tokyo (JP); Masahiko Nakamae, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/501,522

(22) PCT Filed: Oct. 22, 2003

(86) PCT No.: PCT/JP03/13514

§ 371 (c)(1),
(2), (4) Date: Jul. 16, 2004

(87) PCT Pub. No.: WO2004/038790

PCT Pub. Date: May 6, 2004

(65) Prior Publication Data

US 2005/0081958 A1   Apr. 21, 2005

(30) Foreign Application Priority Data

Oct. 22, 2002   (JP) .............................. 2002-307478

(51) Int. Cl.
*H01L 21/30* (2006.01)

(52) U.S. Cl. .............................. 438/459; 257/E21.568

(58) Field of Classification Search ................ 438/106, 438/118, 455, 458, 459; 257/E21.568
See application file for complete search history.

(56) References Cited

U.S. PATENT DOCUMENTS

| | | | | |
|---|---|---|---|---|
| 3,902,936 A | * | 9/1975 | Price | 438/406 |
| 5,091,330 A | * | 2/1992 | Cambou et al. | 438/406 |
| 5,238,865 A | | 8/1993 | Eguchi | 437/62 |
| 5,313,092 A | * | 5/1994 | Tsuruta et al. | 257/620 |
| 5,346,848 A | * | 9/1994 | Grupen-Shemansky et al. | 438/406 |
| 5,804,086 A | * | 9/1998 | Bruel | 216/33 |
| 5,804,495 A | * | 9/1998 | Saito et al. | 438/459 |
| 6,060,344 A | * | 5/2000 | Matsui et al. | 438/164 |
| 6,114,197 A | * | 9/2000 | Hsu | 438/199 |
| 6,124,185 A | * | 9/2000 | Doyle | 438/458 |

(Continued)

FOREIGN PATENT DOCUMENTS

EP   0 191 476 A2   8/1986

(Continued)

*Primary Examiner*—Michael Lebentritt
*Assistant Examiner*—Stanetta Isaac
(74) *Attorney, Agent, or Firm*—Kubovcik & Kubovcik

(57) ABSTRACT

A plurality of recessed portions having different depths is formed in a surface of the active layer wafer or in a bonding surface of the supporting substrate wafer. Those wafers are bonded to each other with an insulation film interposed therebetween. This allows a cavity of higher dimensional precision to be buried therein. A plurality of cavities may be formed simultaneously in a plurality of locations within the plane of the substrate, which allows the thickness of the SOI layer to be set arbitrarily. Accordingly, such a semiconductor device can be fabricated easily in which a MOS type element and a bipolar element are formed on the same chip in a mixed manner.

10 Claims, 8 Drawing Sheets

U.S. PATENT DOCUMENTS

| | | | |
|---|---|---|---|
| 6,191,007 B1 | 2/2001 | Matsui et al. | 438/459 |
| 6,534,380 B1* | 3/2003 | Yamauchi et al. | 438/455 |
| 6,613,652 B2* | 9/2003 | Lim et al. | 438/459 |
| 6,660,564 B2* | 12/2003 | Brady | 438/119 |
| 6,673,694 B2* | 1/2004 | Borenstein | 438/411 |
| 6,759,282 B2* | 7/2004 | Campbell et al. | 438/149 |
| 6,809,009 B2* | 10/2004 | Aspar et al. | 438/459 |
| 6,841,861 B2* | 1/2005 | Brady | 257/678 |
| 6,958,255 B2* | 10/2005 | Khuri-Yakub et al. | 438/48 |
| 2002/0190319 A1* | 12/2002 | Borenstein | 257/347 |
| 2004/0070032 A1* | 4/2004 | Mori et al. | 257/348 |
| 2004/0113228 A1* | 6/2004 | Yamada et al. | 257/507 |

FOREIGN PATENT DOCUMENTS

| | | |
|---|---|---|
| EP | 1 213 748 A2 | 6/2002 |
| JP | 9-135030 A | 5/1997 |
| JP | 11-145481 A | 5/1999 |
| JP | 2001-144276 A | 5/2001 |
| KR | 1998-69868 A | 10/1998 |

* cited by examiner

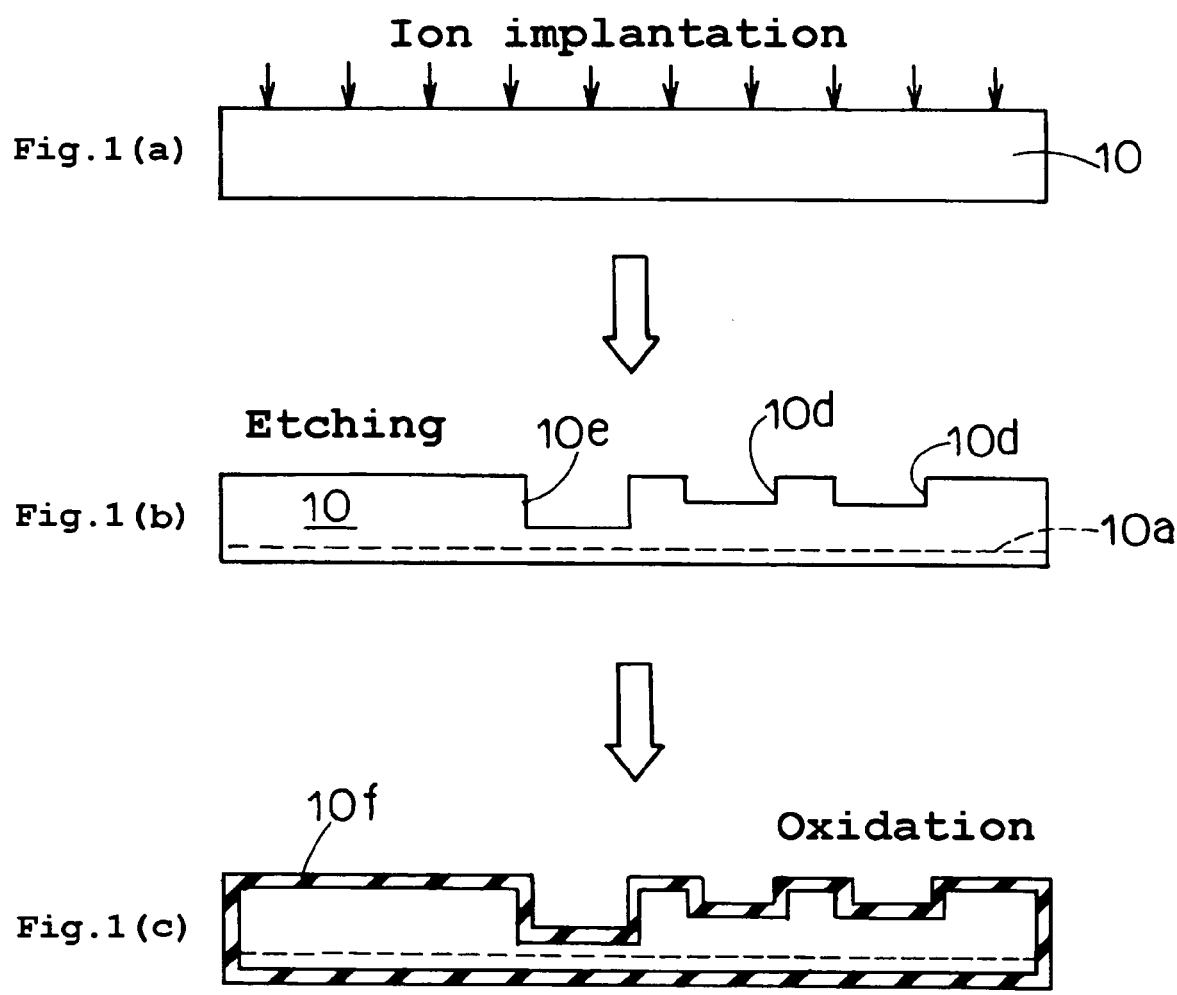

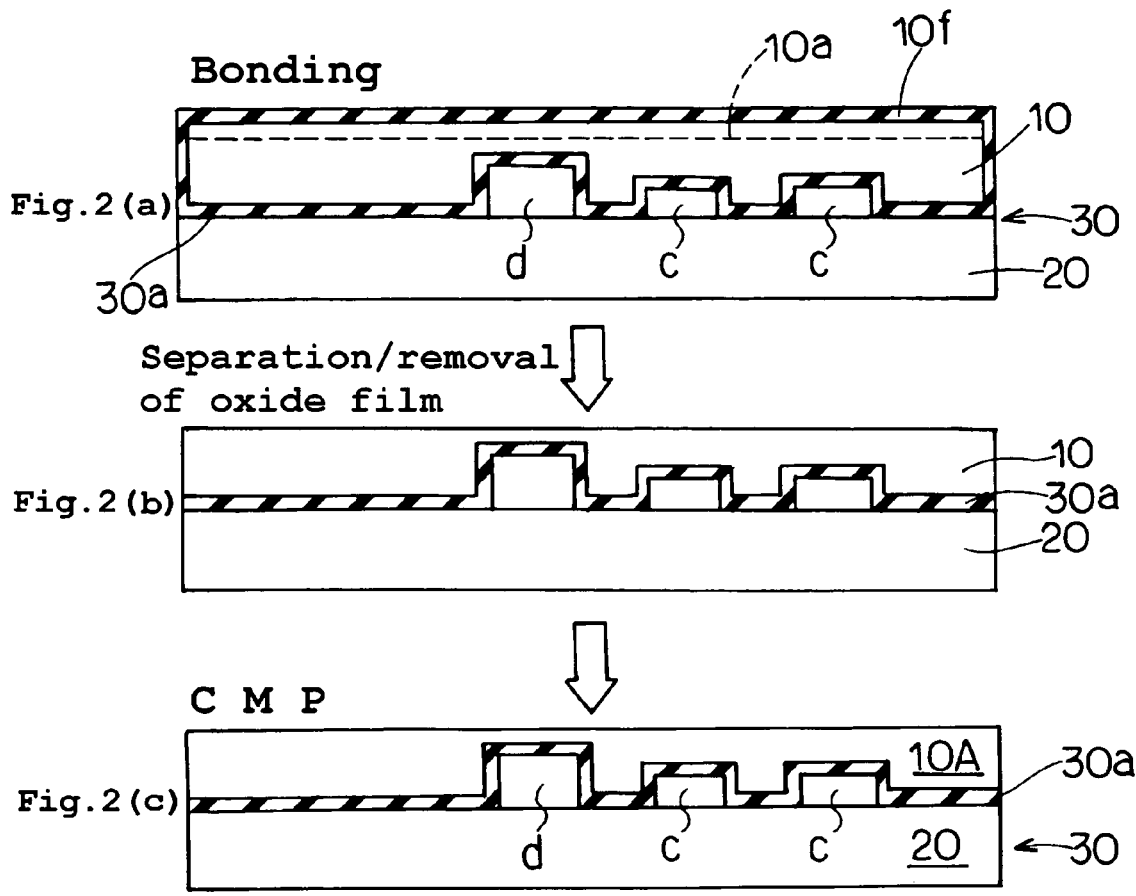
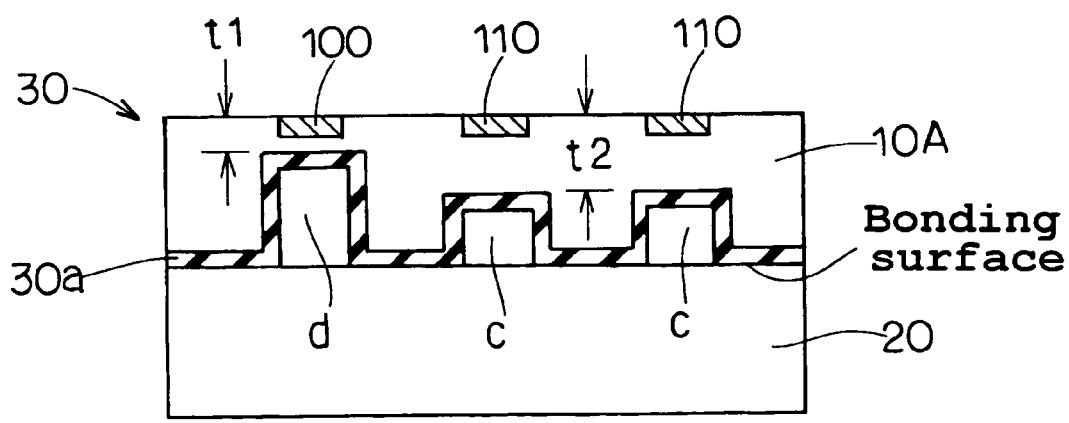

PASTED SOI SUBSTRATE, PROCESS FOR PRODUCING THE SAME AND SEMICONDUCTOR DEVICE

FIELD OF THE INVENTION

The present invention relates to a bonded SOI substrate and a manufacturing method thereof and a semiconductor device using said substrate, and more specifically to a technology in which after an active layer wafer and a supporting substrate wafer having been bonded to each other with an insulation layer interposed between them, the active layer wafer is thinned to define a SOI layer.

DESCRIPTION OF THE PRIOR ART

In a trend of increasing demand for higher integration as well as more multi-functionality in a LSI fabricated on a silicon substrate, separation among respective elements turns out now to be a subject of importance. In the LSI according to the prior art, which typically resides on a silicon wafer having a thickness in a range of 500 μm to 800 μm, electronic circuit elements are integrally fabricated in a surface layer thereof (defined by a depth of some ten μm from a surface).

A SOI (Silicon On Insulator) substrate has been known as a solution to the problem of separation among such elements. The SOI substrate comprises a SOI layer in which a device is to be formed, and a supporting substrate wafer for supporting said SOI layer, wherein a buried silicon oxide film having a thickness of several μm is disposed between the SOI layer and the supporting substrate wafer.

This SOI substrate can facilitate the high integration of the device, including the multi-functionality using a three dimensional structure, provide reduced soft errors and higher reliability, and also suppress consumption of electric power.

Conventionally, one known type of the SOI substrate according to the prior art is represented by "a semiconductor substrate" as disclosed in the Japanese Patent Laid-open Publication No. 2001-144276. In a configuration of this semiconductor substrate, a two-dimensional array of a plurality of trenches (recesses) is formed on surface of silicon substrate, which in turn is heat-treated to thereby induce a migration of silicon atoms in the surface layer of the substrate, causing inner walls in the openings of said respective trenches to be coupled with each other to define a device forming area (i.e., SOI layer), while causing inner portions of respective trenches to be coupled to each other to define a plate-like cavity (i.e., insulation layer).

However, according to the prior art semiconductor substrate and manufacturing method thereof, a control of the dimension of the trench to be formed in the surface of the semiconductor substrate and/or a control of the heat treatment condition for forming the plate-like cavity through the migration of the silicon atoms have been found difficult. Consequently, it has been difficult to fabricate the SOI structure exactly as specified in its design.

In this circumstance, the inventors have devoted themselves in an enthusiastic research and recognized the importance of the bonded SOI substrate. That is, they have made the present invention based on the finding that during manufacturing of the bonded SOI substrate, if a recessed portion is formed in the surface of the active layer wafer and/or in the surface of the supporting substrate wafer and then said active layer wafer and said supporting substrate wafer are bonded to each other with said surfaces serving as the bonding surfaces, then such a SOI substrate can be fabricated that has a cavity formed inside thereof substantially in accordance with the specified design.

Therefore, an object of the present invention is to provide a bonded SOI substrate and a manufacturing method thereof, which allows a cavity of higher dimensional precision to be buried therein as an insulation layer.

Another object of the present invention is to provide a bonded SOI substrate and a manufacturing method thereof, which allows MOS elements and bipolar elements to be arranged in a mixed manner on the same chip.

SUMMERY OF THE INVENTION

A first invention provides a SOI substrate comprising: a SOI layer in which a device is to be formed; and a supporting substrate wafer for supporting said SOI layer, said SOI layer and said supporting substrate wafer having been bonded to each other with an insulation layer interposed therebetween, in which said insulation layer includes a cavity.

As for the SOI wafer and the supporting substrate wafer, a variety type of wafers may be employed, including, for example, a single-crystal silicon wafer and a gallium-arsenide wafer.

The type of the device to be formed in the SOI layer may not be limited. The device may include, for example, a MOS type element, a bipolar element, a variety type of diodes and a variety type of transistors, a memory and a processor for further applications, and a variety type of digital circuits and a variety type of analog circuits for yet further applications.

The thickness of the SOI layer may not be limited. For example, the SOI layer of thicker film may be 20 μm to 50 μm thick. The SOI layer of thinner film may be 0.01 μm to 20 μm thick.

The cavity may be formed substantially across the entire region in the plane of the SOI layer. Alternatively, the cavity may be formed partially in the plane. The shape of the cavity may be circular, elliptical, triangular, rectangular or other polygonal shape in plan view.

The height of the cavity (the length in the thickness direction of the substrate) may be in a range of 0.01 μm to 50 μm, preferably in a range of 0.01 μm to 5 μm.

According to the bonded SOI substrate defined by the first invention, the SOI substrate having the cavity serving as the insulation layer can be easily obtained. Consequently, the degree of freedom in shape and location of the cavity may be extended. Further, designing of a desired device, circuit and the like may be facilitated. For example, such a semiconductor device including the MOS elements and the bipolar elements disposed in a mixed manner can be easily fabricated.

A second invention provides a SOI substrate in accordance with the first invention, in which said cavity is formed at a plurality of locations in a plane of said bonded SOI substrate.

The cavity may be formed in response to a design of the desired device, circuit and the like.

A third invention provides a SOI substrate in accordance with the first or the second invention, in which said insulation layer has a plurality of cavities defined by different heights.

The cavities may be formed in the bonding surface of the SOI layer or/and in the bonding surface of the supporting substrate wafer. Further, the insulation film may be formed in both bonding surfaces of the SOI layer and the supporting substrate wafer. The surface on which the insulation film is to be formed is not limited to the bonding surface of the SOI layer and/or the supporting substrate wafer. It may be formed, for example, across the entire surface of the SOI layer and/or the supporting substrate wafer.

A fourth invention provides a SOI substrate in accordance with the first invention, in which said SOI layer has varied thickness in the plane thereof.

Each suitable element may be formed in each region of varied thickness.

Fifth invention provides a manufacturing method of a SOI substrate, comprising: a recessed portion forming step for forming a recessed portion in a surface of an active layer wafer and/or in a surface of a supporting substrate wafer; a bonding step for bonding said active layer wafer and said supporting substrate wafer to each other with said surface(s) having said recessed portion(s) formed therein serving as bonding surface(s) to thereby form a cavity; and a thinning step for thinning said active layer wafer of said bonded wafers to thereby form a SOI layer.

The location where the recessed portion is formed may be in the surface of the active layer wafer. Alternatively, it may be in the surface of the supporting substrate wafer. Further, the recessed portion may be formed in both surfaces of the active layer wafer and the supporting substrate wafer.

To form the recessed portion, a variety of techniques, including the photolithography, for example, may be used. A depth, an extent and a shape of the recessed portion may be arbitrarily determined. In one example, a patterning mask having a patterned hole defining the same configuration as of the recessed portion is placed over the top of the wafer in which the recessed portion is to be formed, and then said wafer is etched by a predetermined etching method through the patterned hole to form a recessed portion on the surface of the wafer. The type of etching method may not be limited. For example, the acid etching using a mixed acid of hydrofluoric acid mixed with nitric acid or the alkali etching using NaOH or KOH may be employed. Other than the above, a variety of dry etching may be employed.

Further, this recessed portion can be also formed by the method other than the etching. That is, the wafer surface in the region other than the recessed portion may be raised by a variety type of thin film deposition methods thus to define a relatively recessed portion. Specifically, a mask having a patterned hole encompassing the region excluding that for forming this recessed portion is formed by the photolithography on top of the wafer in which the recessed portion is to be formed. After that, a thin film is formed over the wafer surface by a predetermined thin film deposition method via this patterned hole. Subsequently, in this method, the mask is removed to make the recessed portion of specified dimension emerge in the surface of the wafer.

The thin film deposition method may include, for example, the spattering method, the vacuum deposition method, the CVD method and the epitaxial growth method.

The bonding of the active layer wafer with the supporting substrate wafer may be achieved, for example, by bonding the two wafers to each other at a room temperature and then applying the bonding heat treatment thereto. The heating temperature in this bonding heat treatment may be 800° C. or higher, 1100° C., for example. The time period of the bonding heat treatment may be two hours, for example. The atmospheric gas in the thermal oxidation furnace to be used may employ oxygen and the like.

As the thinning method of the active layer wafer, for example, such a method may be employed in which light elements such as hydrogen ions are implanted into the active layer wafer from its thermally oxidized surface side, and then the active layer wafer and the supporting substrate wafer are bonded to each other and heat treated. At this time, the smart-cut method may be employed, in which an unnecessary portion of the active layer wafer is separated from the region where the hydrogen ions have been implanted.

In addition, the thinning method by the surface grinding and the surface polishing may be employed, for example. Further, as an alternative thinning method, the etch stop method may be employed.

That is the method in which the surface grinding is applied to the active layer wafer side of the bonded wafer, and then thus surface-ground surface is further applied with the surface polishing to thereby produce the SOI layer. During the surface grinding of the active layer wafer, for example, the surface grinding wheel may be used. As for the surface polishing, for example, the polishing by the polishing machine may be employed. That is, after having been processed with the surface grinding, the bonded wafer is mounted on a polishing head and polished in the condition where the ground surface of the active layer wafer is pressed against polishing cloth affixed on a turn table while supplying a polishing agent (slurry) containing loose abrasive in a polishing liquid. The thinning of the active layer wafer may be accomplished exclusively by the surface polishing. In that case, adjusting of the polishing condition for the active layer wafer may be required.

As for the polishing machine, a single type wafer polishing machine or a batch type wafer polishing machine may be used. Further, either a wax type single side polishing machine or a waxless type polishing machine may be used.

As for the polishing cloth, may be employed, for example, a porous non-woven type polishing cloth made of polyester felt impregnated with polyurethane, an expanded urethane type polishing cloth made by slicing a block of expanded urethane and a suede type polishing cloth made by laminating expanded polyurethane on top of a base material of polyester felt impregnated with polyurethane and then removing the surface layer portion of said polyurethane to resultantly form an opening in the layer of expanded polyurethane.

According to the manufacturing method of the bonded SOI substrate defined by the fifth invention, firstly the recessed portion is formed in the surface of the active layer wafer and/or in the bonding surface of the supporting substrate wafer, and secondly the two wafers are bonded to each other. In this way, the cavity of highly precise dimension can be buried and formed as the insulation layer. Further, the cavities can be simultaneously made in a plurality of locations in the substrate plane, and more advantageously the thickness of the SOI layer defined by those cavities can be arbitrarily determined in an easy manner. Therefore, for example, such a semiconductor device including the MOS type elements and the bipolar elements that are loaded in a mixed manner on the same chip can be fabricated easily.

A sixth invention provides a manufacturing method of a bonded SOI substrate in accordance with the fifth invention, in which in said recessed portion forming step, said cavity is formed in a plurality of locations in the surface of said active layer wafer and/or in the surface of said supporting substrate wafer.

This allows a design to be made in response to a desired semiconductor device.

A seventh invention provides a manufacturing method of a bonded SOI substrate in accordance with the fifth or the sixth invention, in which in said recessed portion forming step, a plurality of recessed portions having varied depths is formed in the surface of said active layer wafer and/or in the surface of said supporting substrate wafer.

To differentiate the depth, for example, such technique may be employed in which an etching with a photo mask is repeated two or more times.

An eighth invention provides a manufacturing method of a bonded SOI substrate in accordance with any one of the fifth through the seventh inventions, in which in said bonding step, an insulation film has been formed on said bonding surface of said active layer wafer and/or on said bonding surface of said supporting substrate wafer.

Forming of the insulation film may be achieved by a thermal oxidation, for example.

A ninth invention provides a manufacturing method of a bonded SOI substrate in accordance with the fifth invention, in which said bonding step is carried out in a vacuum atmosphere or under a vacuum condition.

The bonding step may be performed at 10 torr under a room temperature, for example. The bonding may be carried out by using a known jig.

A tenth invention provides a manufacturing method of a bonded SOI substrate in accordance with the fifth invention, in which said thinning step includes a step for grinding and polishing of said active layer wafer after having been bonded.

An eleventh invention provides a manufacturing method of a bonded SOI substrate in accordance with the fifth invention, further comprising a step for performing an ion implantation to a location in a specified depth in said active layer wafer, wherein said thinning step includes, in the course of a heat treatment following to said bonding step, a step for separating a surface side of said active layer wafer from said ion-implanted region.

A twelfth invention provides a semiconductor device comprising a bonded SOI substrate in which a SOI layer having varied thickness is formed over a plane thereof, wherein a functional block defined by a CMOS logic is formed in the thinnest region of said SOI layer and a memory functional block and/or an analog functional block are formed in the other regions of said SOI layer.

In the semiconductor device according to the twelfth invention, since the functional block of the CMOS logic is formed in the thinnest region of the SOI layer, while the memory functional block or the analog functional block is formed in the other region of the SOI layer, therefore respective functions of those elements can be performed efficiently. For example, the CMOS may be formed in the cavity forming region of the SOI layer, while the memory may be formed in no-cavity forming region of the SOI layer. Alternatively, the CMOS may be formed in the region of deep cavity, while the memory may be formed in the region of shallow cavity.

A thirteenth invention provides a semiconductor device in accordance with the twelfth invention, in which a basic unit block of the CMOS logic is formed in the thinnest region of said SOI layer.

When the basic unit block of the CMOS logic is arranged in this thinned region, such a semiconductor device of mixed loading type can be obtained, which allows the feature of each element to be functioned in an optimally effective manner respectively.

A fourteenth invention provides a semiconductor device in accordance with the thirteenth invention, in which a unit transistor is formed in the thinnest region of said SOI layer.

When the unit transistor is formed in this region, such a semiconductor device of mixed loading type can be obtained, which allows the feature of each element to be functioned in an optimally effective manner respectively.

A fifteenth invention provides a semiconductor device in accordance with the fourteenth invention, in which a channel of the unit transistor is formed in the thinnest region of said SOI layer.

When the channel of the unit transistor is formed in this region, such a semiconductor device of mixed loading type can be obtained, which allows the feature of each element to be functioned in an optimally effective manner respectively.

BRIEF DESCRIPTION OF THE DRAWINGS

FIG. 1 is a flow sheet showing processing steps of an active layer wafer in a manufacturing method of a bonded SOI substrate according to a first embodiment of the present invention;

FIG. 2 is a flow sheet showing fabricating steps of a bonded wafer in the manufacturing method of a bonded SOI substrate according to the first embodiment of the present invention;

FIG. 3 is a sectional view showing a semiconductor device formed in a bonded SOI substrate according to the first embodiment of the present invention;

DESCRIPTION OF THE PREFERRED EMBODIMENTS

Figure 4:
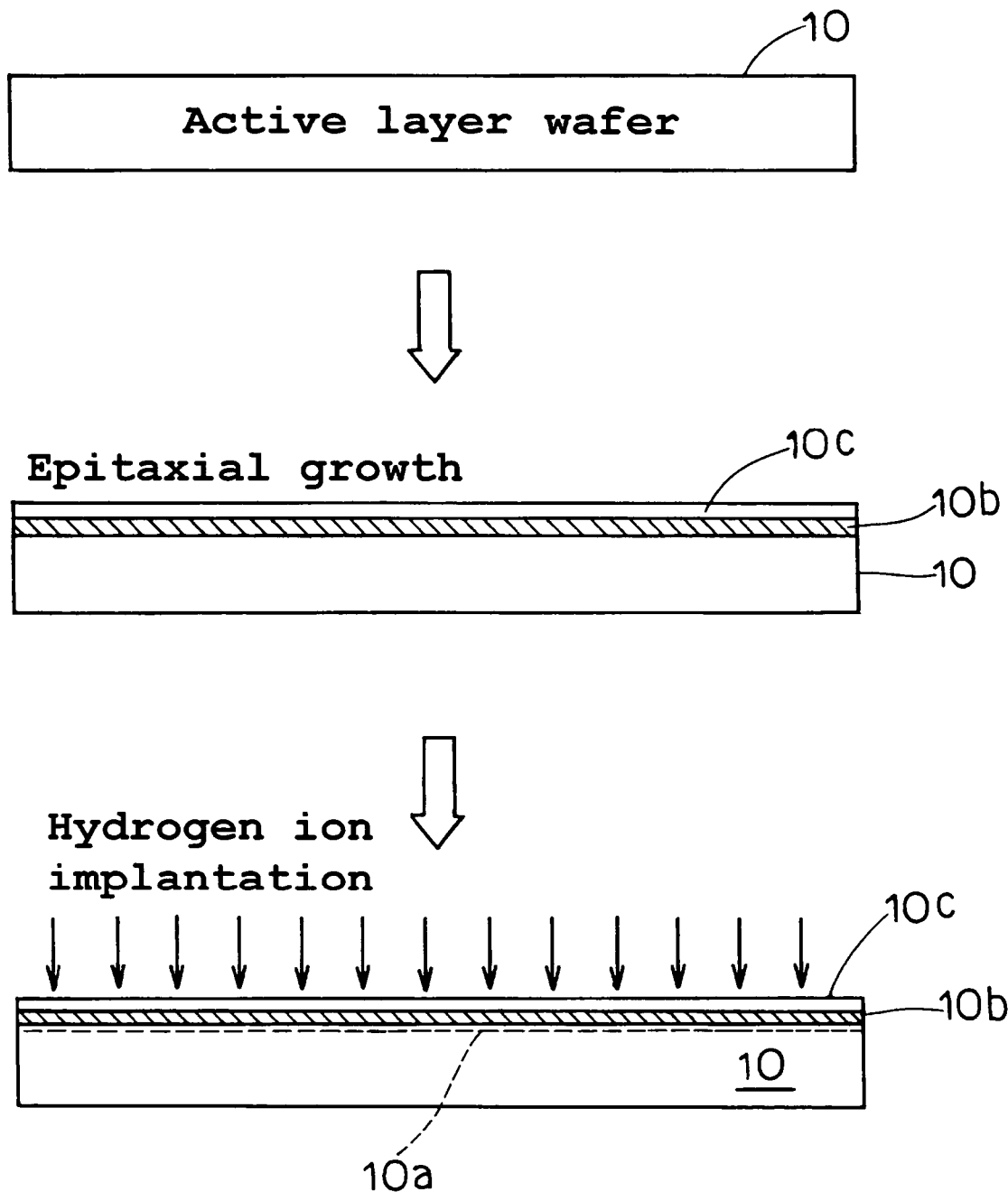
FIG. 4 is a flow sheet showing processing steps of an active layer wafer in a manufacturing method of a bonded SOI substrate according to a second embodiment of the present invention.

Preferred embodiments of the present invention will now be described with reference to the attached drawings.

Referring to FIG. 1 through FIG. 3, a bonded SOI substrate and a manufacturing method thereof according to a first embodiment of the present invention will be described.

The bonded SOI substrate according to this embodiment is characterized in that a predetermined number of shorter cavities "c" and a predetermined number of taller cavities "d" defining their heights taller than said shorter cavities "c" reside in an active layer wafer 10 side with respect to a bonding interface between an active layer 10A and a supporting substrate wafer 20. This difference in height results in a difference in thickness of the SOI layer (active layer) 10A in these regions. In FIG. 3, the SOI layer 10A having the thickness "t1" is formed above the cavity "d" and the SOI layer 10A having the thickness "t2" is formed above the cavity "c", respectively. It is to be noted that t1<t2.

As it is, a CMOS transistor 100 will be formed in this region of the thinner silicon layer and a bipolar transistor 110 will be formed in the region of the thicker silicon layer, respectively.

A manufacturing method of this bonded SOI substrate will be explained below.

Firstly, hydrogen ions are ion-implanted in accordance with a specified condition into a back surface (at a location defined by a predetermined depth from a surface of mirror-surface) of the silicon wafer 10 for the active layer having fabricated by a known method. FIG. 1(a) shows this ion implantation is being carried out. 10a indicates the region where the hydrogen ions are implanted.

Secondly, a reactive ion etching apparatus is used to form recessed portions 10d each defined by an opening area of 1 mm$^2$×a depth of 0.5 μm and recessed portions 10e each defined by an opening area of 1 mm$^2$×a depth of 1.0 μm with the ion etching in the surface of the active layer silicon wafer 10. FIG. 1(b) shows the condition after the etching. To obtain different depths, for example, a plurality of types of mask is prepared for the etching, and the etching is applied in a plurality of steps.

After that, a silicon oxide film 10f is formed across the entire exposed surface of the active layer wafer 10 including the recessed portions 10d, 10e by the thermal oxidation processing at 900° C. in the oxygen gas atmosphere.

Subsequently, the surface of the active layer silicon wafer 10 (i.e., the surface having the recessed portions) and the mirror-surface of the previously prepared supporting substrate wafer 20 (i.e., the silicon wafer fabricated in the same process as the active layer wafer 10) are used as the bonding surfaces (laminating surfaces), and the two wafers 10 and 20 are now bonded to each other using, for example, a known jig in a vacuum unit. At this time, an insulation layer will be formed between the active layer wafer 10 and the supporting substrate wafer 20, which insulation layer comprises a predetermined number of cavities "c" each defined by the opening area of 1 mm$^2$×the height of 0.5 μm, a predetermined number of cavities "d" each defined by the opening area of 1 mm$^2$×the height of 1.0 μm and a buried oxide film 30a located in the bonding surface side of the silicon oxide film 10f. FIG. 2(a) shows a state after this bonding step.

After that, the heat treatment at a low temperature is applied to the bonded wafer 30 at 500° C. for one hour to thereby form a hydrogen bubble region 10a within the active layer wafer 10. The hydrogen ions having been implanted in the above-mentioned step form the bubbles.

Subsequently, the predetermined bonding heat treatment (1100° C., two hours) is applied to this bonded wafer 30.

As a result from the above steps, unnecessary portion of the active layer wafer 10 (the portion defined in the surface side) is separated off from the hydrogen bubble region 10a. FIG. 2(b) shows a condition where the oxidation film has been removed after the separation. In addition, the bonding strength of the bonded wafer 30 is enhanced by this bonding heat treatment.

In the following step, the separation surface of the active layer wafer 10 is subjected to the CMP processing (polishing) or the hydrogen bake processing to thereby fabricate a bonded SOI substrate. FIG. 2(c) shows its resultant condition. The surface of the active layer wafer is mirror-polished through the polishing. It is to be noted that the element 30a functions as the buried oxide film.

FIG. 3 shows the state where the elements have been formed on thus fabricated bonded SOI substrate. In this SOI substrate, as a result of the cavities "c" and "d" having different heights, which have been formed in the bonding surfaces, the SOI layer 10A right above the cavity "c" and that above the cavity "d" have different thickness from each other. The thin (thickness t1) SOI layer 10A is formed right above the taller cavity "d", and the thick (thickness t2) SOI layer 10A is formed right above the shorter cavity "c", respectively.

To fabricate a semiconductor device by using this SOI substrate, the CMOS logic is formed in the specific region of the SOI layer 10A located above the taller cavity "d", as described above. This is because the region in which the CMOS logic is formed has preferably the thin film where a parasitic capacity could be made as small as possible. Further, the memory or various types of analog circuits (bipolar elements) may be formed in the region located above the shorter cavity "c" (the thicker region) in the SOI layer 10A.

In other applications, for example, a base circuit of the CMOS logic, a unit transistor of the other type than the CMOS logic, a channel of the unit transistor, a variety of complete depletion type SOI device and the like may be formed in the region above the cavity "d" of the SOI layer 10A.

As described above, since the plurality of cavities "c", "d" having different height from each other has been formed, the elements having different structures from each other are allowed to reside in a mixed manner on the same chip.

Figure 5:
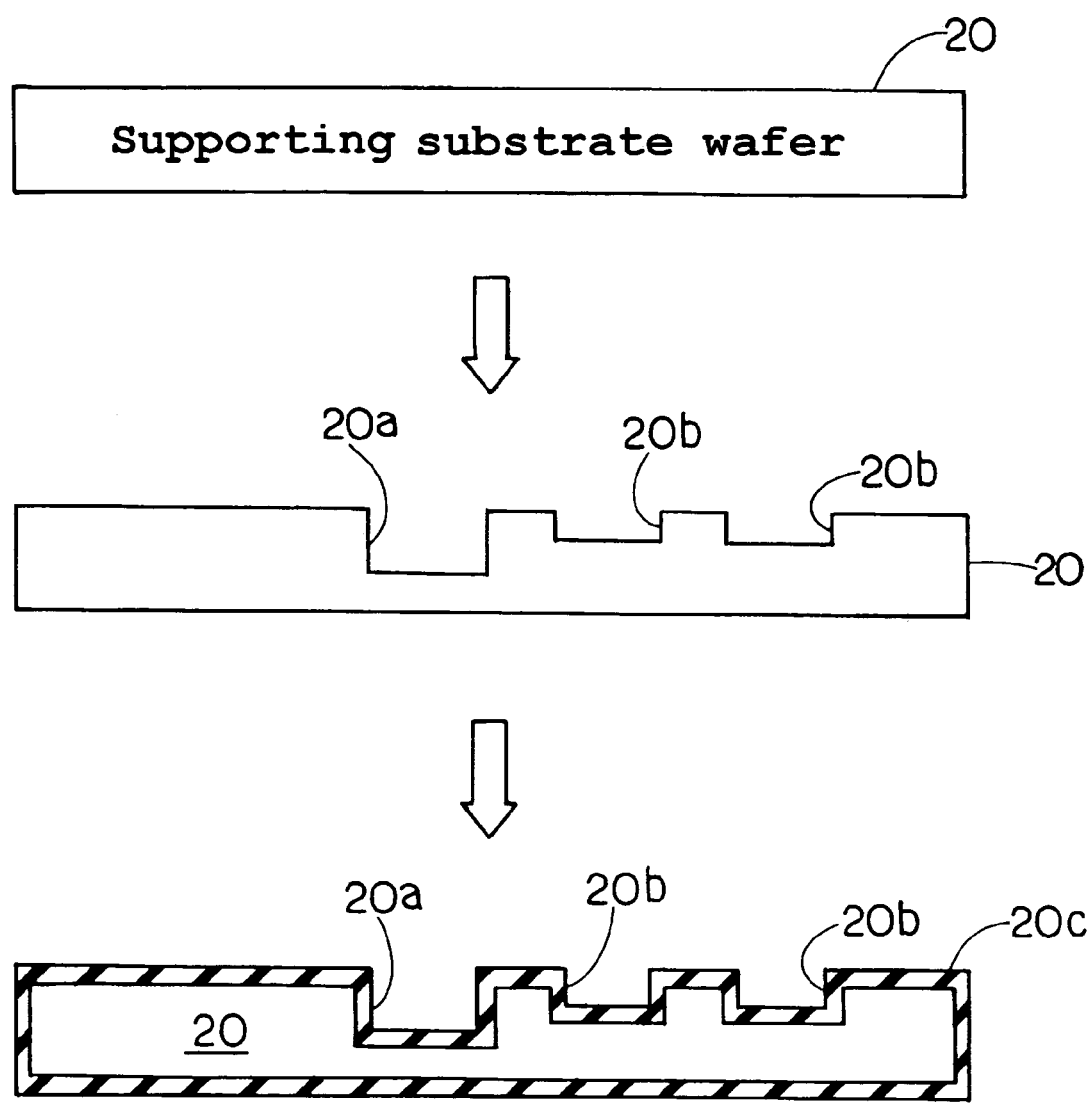
FIG. 5 is a flow sheet showing preparation steps of a supporting substrate wafer in the manufacturing method of a bonded SOI substrate according to the second embodiment of the present invention.
Figure 6:
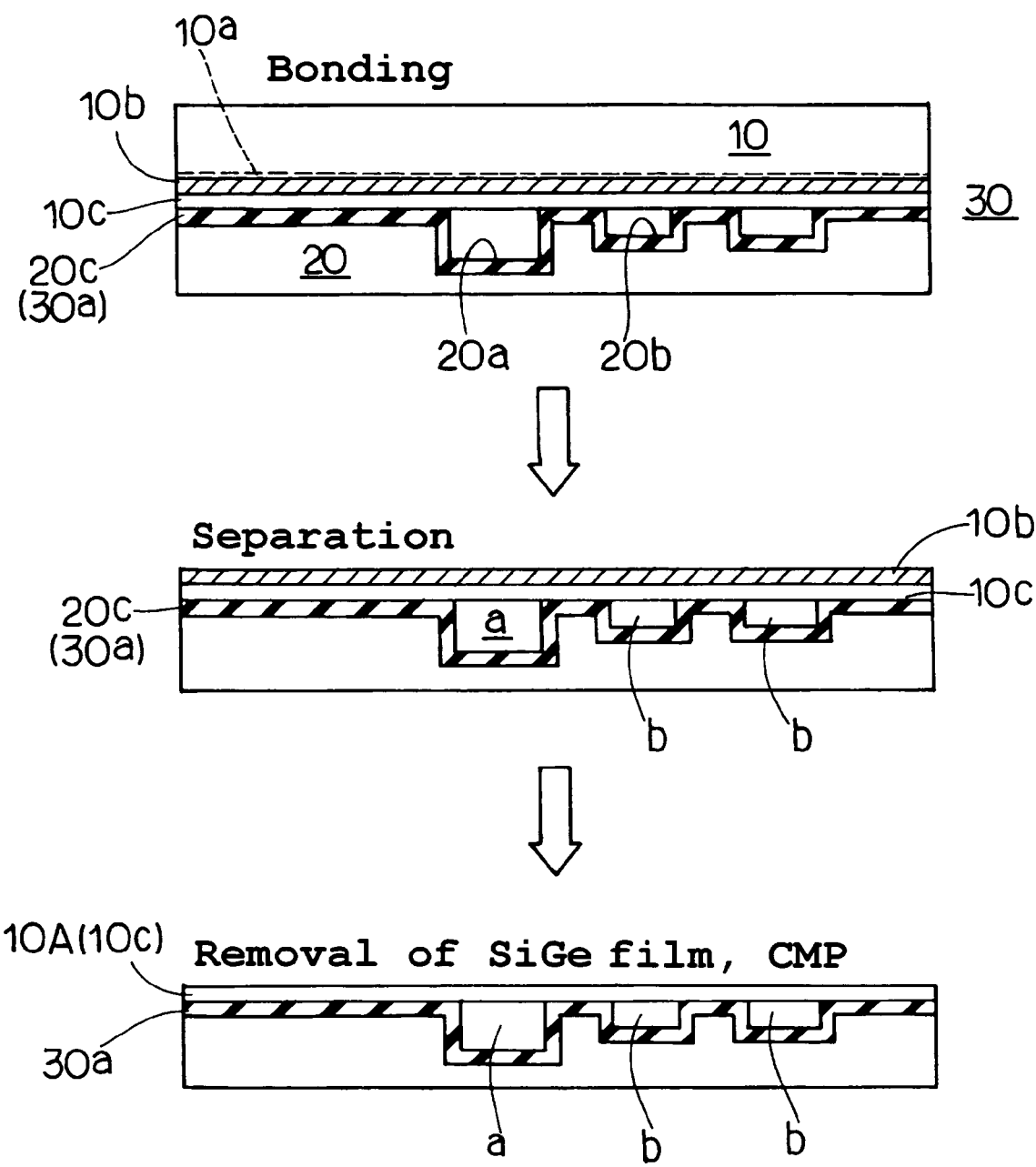
FIG. 6 is a flow sheet showing processing steps of a bonded wafer in the manufacturing method of a bonded SOI substrate according to the second embodiment of the present invention.

Turning now to FIG. 4 through FIG. 6, a second embodiment of the present invention is illustrated.

The manufacturing method of the SOI substrate according to this embodiment is characterized in that in the step prior to the hydrogen ion implantation, firstly a silicon-germanium thin film 10b is epitaxially-grown on the surface (mirror-surface) of the active layer silicon wafer 10, and secondly a silicon thin film 10c is successively epitaxially-grown on the surface of the silicon-germanium thin film 10b, as shown in FIG. 4.

It is to be noted that as the active layer silicon wafer 10, such a silicon wafer may be employed that has been pulled up by the CZ method (Czochralski method) and processed by the slicing, beveling, lapping, etching and mirror-surface polishing.

Subsequently, the hydrogen ions are implanted into the interface between this silicon-germanium (SiGe) thin film 10b and the active layer wafer 10 or into the SiGe film 10b, or otherwise into the silicon substrate immediate below the SiGe film such that the hydrogen ion concentration reaches its peak in those regions. Reference numeral 10a indicates the hydrogen ion implanted region. In this way, the active layer wafer 10 to be bonded is fabricated.

On the other hand, as for the supporting substrate silicon wafer 20, the predetermined recessed portions 20a, 20b are formed in its bonding surface (mirror-surface) by the photolithography or the like, as shown in FIG. 5. The respective recessed portions 20a, 20b are controlled to have different depths from each other. This may be accomplished by, for example, applying different conditions of etching associated with the photo mask to the expected recessed portions 20a and 20b respectively. In the first etching, the recessed portion 20a is exclusively etched by a predetermined depth, and in the subsequent etching, the recessed portions 20a and 20b are etched by a predetermined depths. That is, the recessed portion 20a is etched through two times of etching to be deeper than the recessed portion 20b, for example, as two times deeper as the recessed portion 20b.

Then, after the recessed portions having been formed, the outer surface of the supporting substrate wafer 20 is coated with the oxide film 20c by the thermal oxidation. It is to be noted that the supporting substrate wafer 20 has been formed through the same processes as those for said active layer wafer 10.

Then, as shown in FIG. 6, those active layer wafer 10 and the supporting substrate wafer 20 are bonded to each other thus to fabricate a bonded wafer 30.

That is, under a predetermined vacuum condition (e.g., in the vacuum chamber), the active layer wafer 10 and the supporting substrate wafer 20 are placed one over the other with the surface of the silicon thin film 10c of the former facing the surface (the recessed portion formed surface) of the latter, to thereby bond those two wafers to each other.

Then, the bonded wafer 30 is inserted into the thermal oxidation furnace to be subjected to the predetermined heat treatment. That is, under a condition defined by the oxygen gas atmosphere, the temperature of 500° C. and the processing time of one hour, the hydrogen bubbles are formed in the hydrogen ion implanted region 10a.

Subsequently, the bonding heat treatment is carried out at 1100° C. for two hours. As a result, the bonding strength is enhanced. Through this heat treatment, in the bonded wafer 30, the active layer wafer 10 is separated off from the hydrogen bubble formed region (the interface between the silicon-germanium thin film 10b and the active layer wafer 10).

Thus, the bonded wafer 30 is formed with the silicon oxide film (the buried oxide film) 30a interposed between the bonding surfaces. Then, in this case, the silicon oxide film 30a would include the cavities "a" and "b" in parts thereof (at locations spaced from each other in the same plane).

After the separation, the silicon-germanium thin film 10b is etched by using the etch stop method to remove it and thereby to expose the silicon thin film 10c. In this process, such an etchant is used that has the etching rate for the silicon-germanium greater than that for the silicon. Further, this etching surface is polished by the chemical and mechanical polishing to be the mirror-surface. As a result, a bonded SOI substrate is fabricated, which has the SOI layer 10A comprising the silicon thin film 10c having the predetermined thickness.

Then, the predetermined elements are to be formed in the SOI layer 10A in the regions right above the respective cavities 20a and 20b.

In this way, since such a manufacturing method of the bonded SOI substrate is employed, in which the silicon-germanium thin film 10b and the silicon thin film 10c are sequentially epitaxially-grown on the surface of the active layer wafer 10 and ultimately the silicon thin film 10c is made to function as the active layer 10A, therefore the separation surface is within the silicon-germanium film 10b or within the active layer silicon wafer 10 immediately below the silicon-germanium thin film 10b, and further since unnecessary layer is removed by the etching in the subsequent step, the final roughness of the surface of the SOI layer can be reduced.

Figure 7:
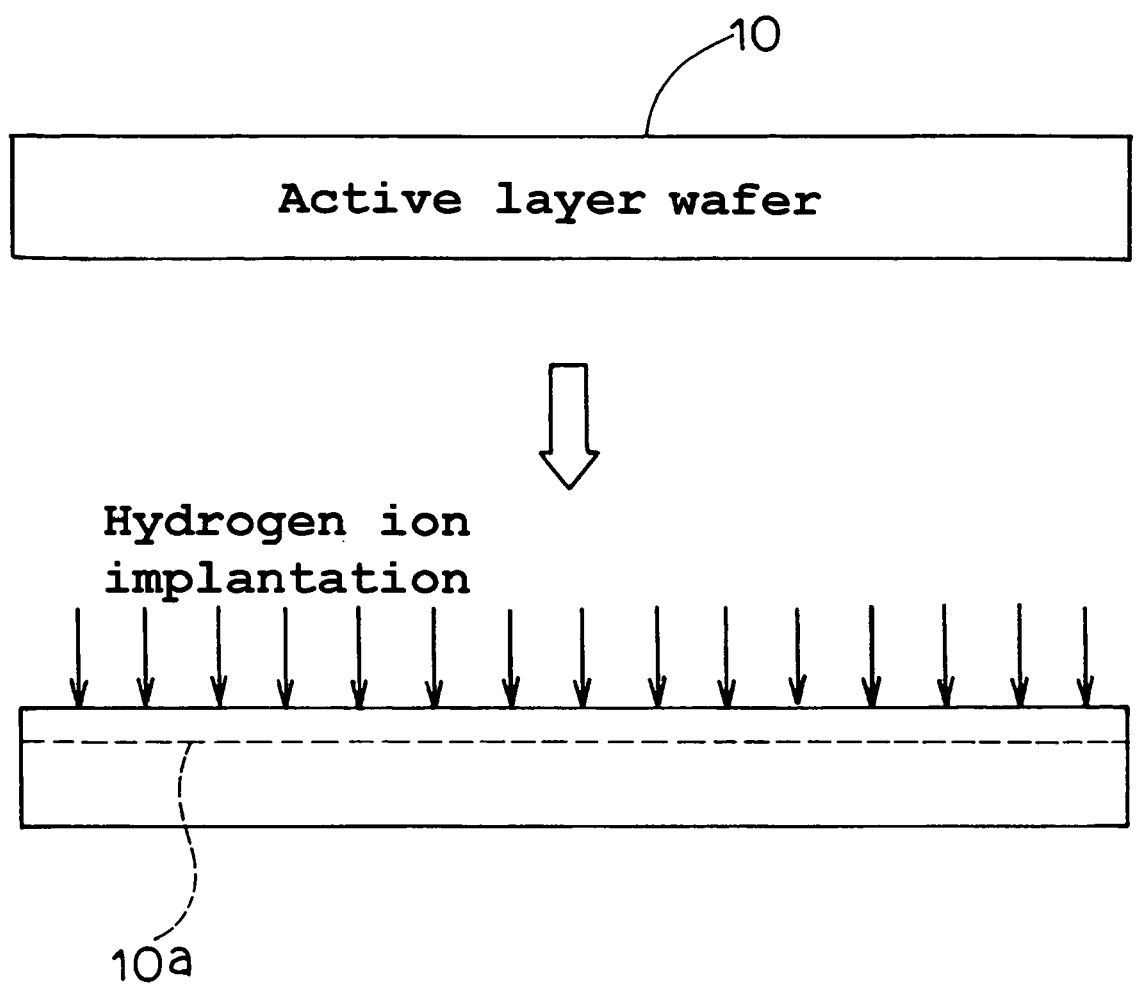
FIG. 7 is a flow sheet showing processing steps of an active layer wafer in a manufacturing method of a bonded SOI substrate according to a third embodiment of the present invention.
Figure 8:
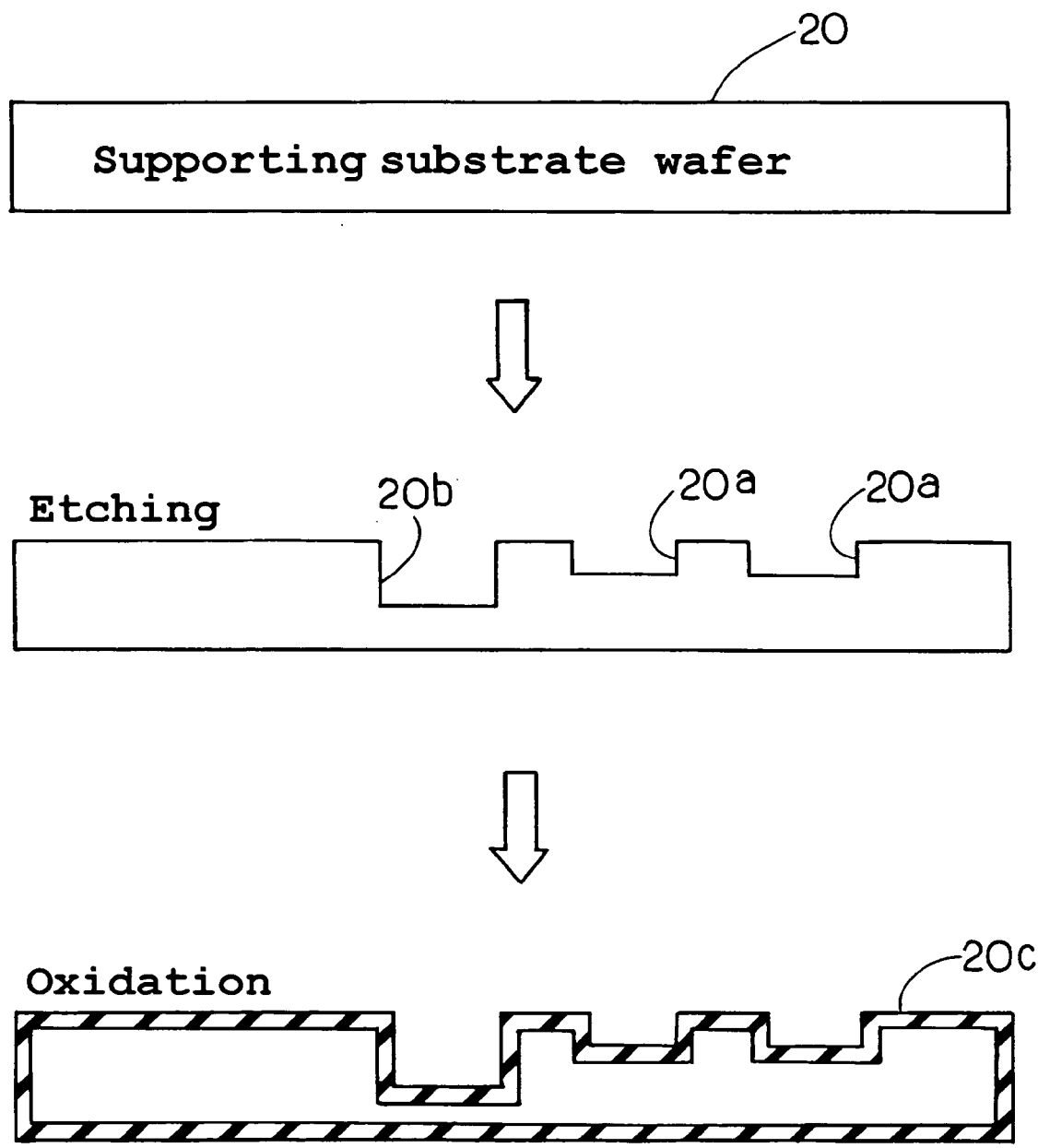
FIG. 8 is a flow sheet showing preparation steps of a supporting substrate wafer in the manufacturing method of a SOI substrate according to the third embodiment of the present invention.
Figure 9:
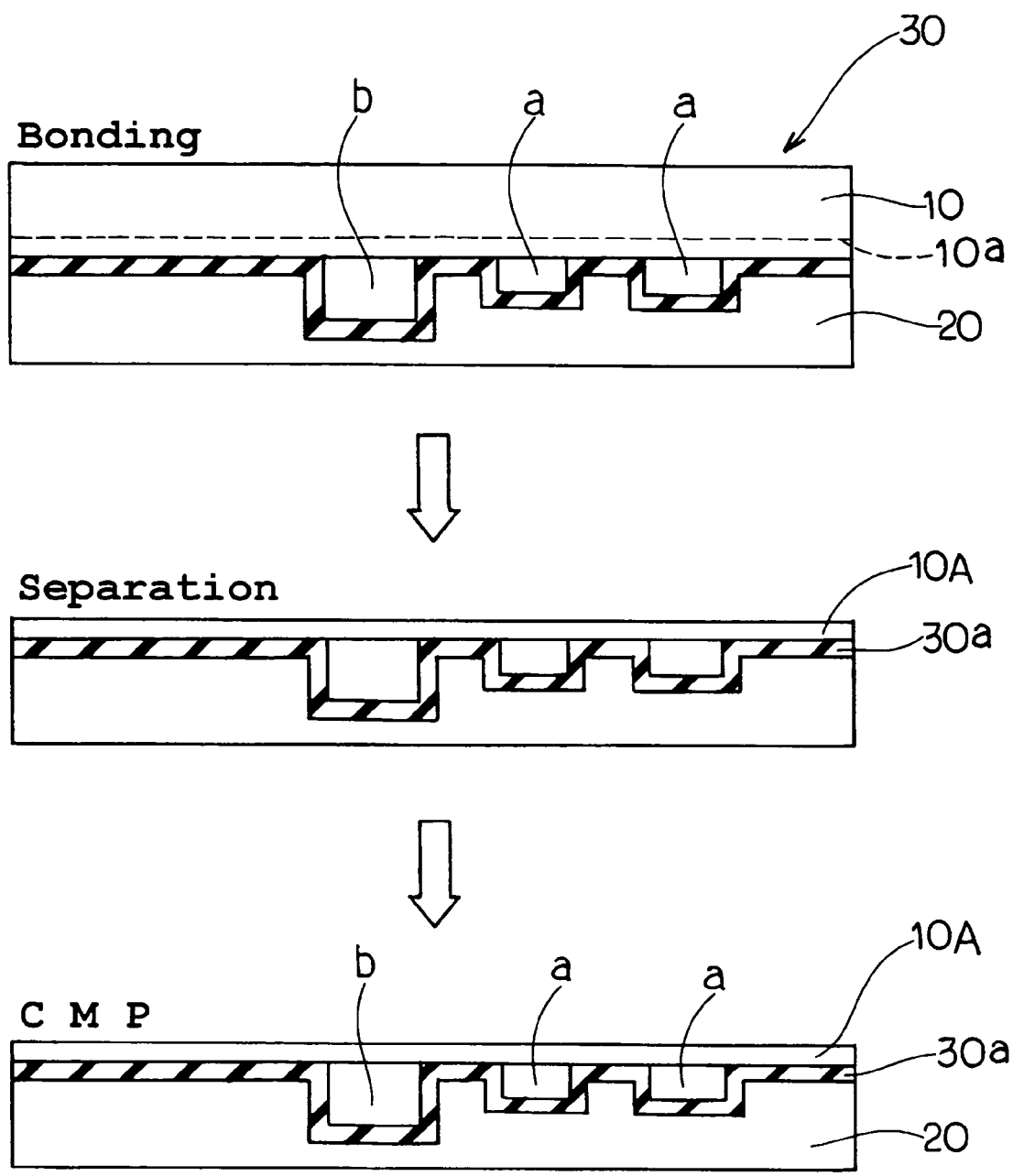
FIG. 9 is a flow sheet showing processing steps of a bonded wafer in the manufacturing method of a bonded SOI substrate according to the third embodiment of the present invention.

Referring now to FIG. 7 through FIG. 9, a third embodiment of the present invention is illustrated.

Firstly, a single crystal silicon ingot that has been pulled up by the CZ method is further processed through the slicing, beveling, lapping, etching and polishing to thereby prepare the active layer wafer 10 having a thickness of 725 μm, a diameter of 200 nm, and an initial oxygen concentration of $14.0 \times 10^{17}$ atoms/cc, with its surface having been mirror-surface finished (FIG. 7).

Secondly, hydrogen ions are implanted at a rate of $5.0 \times 10^{16}$ atoms/cm$^2$ into the active layer wafer 10 by using a medium current ion implanter with an accelerating voltage of 100 keV so as to achieve the depth of implantation of about 2 μm from the wafer surface side. In this way, the hydrogen ion implanted layer 10a is formed in the surface layer of the active wafer 10 at a predetermined depth from a surface thereof as an extending plane.

On the other hand, the supporting substrate wafer 20 is prepared by the same manufacturing method as that used for the active layer wafer 10 so as to have the same thickness, diameter and mirror-surface therewith (FIG. 8).

Subsequently, this supporting substrate wafer 20 is applied with a resist film by 1 μm entirely across the surface thereof by the spin coating method.

After that, by the photolithography technology, a predetermined number of patterned holes, each having the opening area of 1 mm$^2$, is formed in the predetermined locations in the resist film.

Then, through those patterned holes, a plurality of recessed portions 20a each defined by an opening area of 1 mm$^2$×a depth of 0.5 μm and a plurality of recessed portions 20b each defined by an opening area of 1 mm$^2$×a depth of 1.0 μm are formed in a part of the surface of the supporting substrate wafer 20 by the ion etching.

After that, this supporting substrate wafer 20 is inserted into the thermal oxidation furnace, where the wafer 20 is processed with the thermal oxidation at 900° C. while supplying a flow of oxygen gas at a predetermined flow rate. Through this process, the 0.4 μm thick insulating silicon oxide film 20c is formed entirely across the exposed surface of the supporting substrate wafer 20 including entire regions in the inner walls of the recessed portions 20a and 20b.

After that, the active layer wafer 10 and the supporting substrate wafer 20 are placed one over the other under the room temperature in the vacuum device, such that the surface of the hydrogen ion implanted layer 10a side of the active layer wafer 10 and the surface of the recessed portion 20a, 20b side of the supporting substrate wafer 20 serve as the bonding surfaces, thus to form the bonded wafer 30 (FIG. 9). At this time, the pressure inside of the vacuum device is kept to be equal or less than 10 Torr. Bonding the two wafer in the vacuum device allows the mirror finished surface of the active layer wafer 10 and the mirror finished surface in the recessed portion 20a, 20b side of the supporting substrate wafer 20 to be bonded to each other without generating any bad bonding regions therebetween.

After the bonding, in some parts (at specified locations) of the bonding interface, a predetermined number of cavities "a" each defined by the opening area of 1 mm$^2$×the depth of 0.5 μm and a predetermined number of cavities "b" each defined by the opening area of 1 mm$^2$×the depth of 1.0 μm are formed respectively. At this time, the portion of the silicon oxide film 20c interposed between the active layer wafer 10 and the supporting substrate wafer 20 turns out to be the buried silicon oxide film 30a. The thickness of this buried silicon oxide film 30a is 0.4 μm.

As described above, since this illustrated embodiment has been configured such that the bonding method is employed to manufacture the bonded SOI substrate having the cavities "a" and "b", the cavities "a" and "b" can be formed with higher dimensional precision as compared to the prior art using the migration of the silicon atoms.

After that, this bonded wafer 30 is inserted in the thermal oxidation furnace for the bonding heat treatment, where it is processed with the heat treatment for forming bubbles under the oxygen gas atmosphere at 500° C. for one hour. This causes the hydrogen ions implanted in the active layer wafer 10 to react and thus form a region where a large number of hydrogen bubbles is generated in high density.

Subsequently, the bonding heat treatment is carried out at 1100° C. for two hours. This may enhance the bonding strength between the active layer wafer 10 and the supporting substrate wafer 20. During this heat treatment, unnecessary portions of the active layer wafer 10 is separated off from the hydrogen bubble formed region, thus to make the active layer wafer 10 thinner. Consequently, the active layer 10A having the predetermined thickness emerges on the supporting substrate wafer 20 via the insulation layer comprising the cavities "a" and "b" and the buried oxide film 30a. After that, the silicon oxide film, which has been formed on the exposed surfaces of the active layer 10A and the supporting substrate wafer 20 during the heat treatment is removed by applying the HF cleaning process.

Then, the CMP (Chemical Mechanical Polishing) process is applied to the separation surface of this active layer 10A to make it smooth. Through this process, the separation surface of the active layer 10A is finished into mirror-surface. Alternatively, the hydrogen baking may be employed in place of the CMP to process the separation surface of the active layer 10A. Thus, the bonded SOI substrate is fabricated.

As described above, according to the bonded SOI substrate and the manufacturing method of the bonded SOI substrate provided by the present invention, since the recessed portions are formed in the surface of the active layer wafer and/or in the surface of the supporting substrate wafer, and then the active layer wafer and the supporting substrate wafer are bonded to each other such that the surfaces having those recessed portions may serve as the bonding surfaces, therefore the insulation layer comprising cavities of higher dimensional precision can be formed within the substrate.

Further, since a plurality of SOI layers having different thickness are formed within a single substrate, different element structures are formed on the same chip in a mixed manner. For example, the MOS regions and the bipolar device regions may be formed in a mixed manner.

Further, this bonded SOI substrate allows the elements of different structures to be formed thereon in a mixed manner. In that case, the respective elements are allowed to perform their functions effectively. In addition, respective portions of the elements are also allowed to perform their optimal functions. Furthermore, for example, such a configuration may be employed in which each of the MOS type element and the bipolar type element can perform its function sufficiently.

What is claimed is:

1. A bonded SOI substrate comprising:
   a SOI layer in which a device is to be formed; and
   a supporting substrate wafer for supporting said SOI layer, said SOI layer and said supporting substrate wafer having been bonded to each other with an insulation layer interposed therebetween, in which
   said insulation layer comprises an insulation film formed on an entire surface of an active substrate forming the SOI layer and/or on an entire surface of said supporting substrate, and a plurality of cavities defined by different heights, said cavities having an opening area having a circular, elliptical, triangular, rectangular or other polygonal shape in plan view.

2. A bonded SOI substrate in accordance with claim 1, said bonded SOI substrate comprising:
   a SOI layer in which a device is to be formed; and
   a supporting substrate wafer for supporting said SOI layer, said SOI layer and said supporting substrate wafer having been bonded to each other with the insulation layer interposed therebetween, in which
   said SOI layer has varied thickness over a plane thereof.

3. A manufacturing method of a bonded SOI substrate, comprising:
   a recessed portion forming step for forming a recessed portion having an opening area having a circular, elliptical, triangular, rectangular or other polygonal shape in plan view in a surface of an active layer wafer and/or in a surface of a supporting substrate wafer;
   a bonding step for forming an insulation film on an entire surface of an active substrate and/or on an entire surface of said supporting substrate, and bonding said active layer wafer and said supporting substrate wafer to each other with said surface(s) having said recessed portion(s) formed therein serving as bonding surface(s) to thereby form a cavity; and
   a thinning step for thinning said active layer wafer of said bonded wafers to thereby form a SOI layer, wherein
   in said recessed portion forming step, a plurality of recessed portions having varied depth is formed in said surface of said active layer wafer and/or in said surface of said supporting substrate wafer.

4. A manufacturing method of a bonded SOI substrate in accordance with claim 3, in which said bonding step is carried out in a vacuum atmosphere or under a vacuum condition.

5. A manufacturing method of a bonded SOI substrate in accordance with claim 3, in which said thinning step includes a step for grinding and polishing of said active layer wafer after having been bonded together.

6. A manufacturing method of a bonded SOI substrate in accordance with claim 3, further comprising a step for performing an ion implantation to a location in a specified depth in said active layer wafer, wherein
   said thinning step includes, in the course of a heat treatment following to said bonding step, a step for separating a surface side of said active layer wafer from said ion-implanted region.

7. A semiconductor device comprising a bonded SOI substrate in which a SOI layer having varied thickness is formed over a plane thereof and a plurality of cavities defined by different heights and having an opening area having a circular, elliptical, triangular, rectangular or other polygonal shape in plan view are formed at the bonding interface between said SOI layer and said substrate, wherein a functional block defined by a CMOS logic is formed in the thinnest region of said SOI layer and a memory functional block and/or an analog block are formed in the other regions of said SOI layer.

8. A semiconductor device in accordance with claim 7, in which a basic unit block of the CMOS logic is formed in the thinnest region of said SOI layer.

9. A semiconductor device in accordance with claim 8, in which a unit transistor is formed in the thinnest region of said SOI layer.

10. A semiconductor device in accordance with claim 9, in which a channel of a unit transistor is formed in the thinnest region of said SOI layer.

* * * * *